United States Patent
Devarajan et al.

(10) Patent No.: US 9,748,842 B1
(45) Date of Patent: Aug. 29, 2017

(54) SENSE CIRCUIT FOR VOLTAGE CONVERTER

(71) Applicant: TEXAS INSTRUMENTS INCORPORATED, Dallas, TX (US)

(72) Inventors: Vijayalakshmi Devarajan, Plano, TX (US); Gangqiang Zhang, Plano, TX (US); Vaibhav Garg, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/213,217

(22) Filed: Jul. 18, 2016

(51) Int. Cl.
*G05F 1/44* (2006.01)
*H02M 3/158* (2006.01)
*H02M 1/08* (2006.01)
*H02M 1/00* (2006.01)

(52) U.S. Cl.
CPC ............. *H02M 3/158* (2013.01); *H02M 1/08* (2013.01); *H02M 2001/0009* (2013.01)

(58) Field of Classification Search
CPC .......... G05F 1/44; G05F 1/46; H02M 3/1588; H02M 3/1584; H02M 2001/0019; H02M 2001/0032; Y02B 70/1491
USPC .................................. 323/271–274, 282–288
See application file for complete search history.

(56) References Cited

U.S. PATENT DOCUMENTS

| | | | | |
|---|---|---|---|---|
| 6,476,589 B2 * | 11/2002 | Umminger | .......... | H02M 3/1584 323/220 |
| 8,304,931 B2 * | 11/2012 | Gurcan | ................. | H02M 1/088 307/82 |
| 8,686,698 B2 * | 4/2014 | Lopata | ................ | H02M 3/1588 323/224 |
| 8,779,628 B2 * | 7/2014 | Gurcan | ................. | H02M 1/088 307/82 |
| 9,100,019 B2 * | 8/2015 | Akiyama | ............... | H03K 17/94 |

* cited by examiner

*Primary Examiner* — Rajnikant Patel
(74) *Attorney, Agent, or Firm* — Lawrence J. Bassuk; Charles A. Brill; Frank D. Cimino (57) ABSTRACT

A system including a first power transistor including a gate, a second power transistor including a gate and connected in series with the first power transistor, wherein the connection between the transistors defines a switch node is disclosed. The system further includes a pulse width modulator (PWM) controller configured to assert control signals to the gates of the first and second power transistors, a high side sensing circuit coupled to the gate and a drain of the first power transistor. The system further includes a low side sensing circuit coupled to the gate and a drain of the second power transistor, and a track and hold circuit coupled to the high and low side sensing circuits and configured to couple sense signals from the high and low side sensing circuits.

20 Claims, 5 Drawing Sheets

SENSE CIRCUIT FOR VOLTAGE CONVERTER

BACKGROUND

A direct current (DC)-to-DC converter converts a DC input voltage to a desired DC output voltage. A buck converter is a type of DC-to-DC converter in which a controller individually toggles on and off a pair of transistors serially connected between two potential levels (e.g., power and ground) to deliver charge to an inductor, and through the inductor to a capacitor. Sense circuits may be used in a voltage converter to help regulate the output voltage.

SUMMARY

A system includes a first power transistor including a gate; a second power transistor including a gate and connected in series with the first power transistor, where the connection between the transistors defines a switch node. The system also includes a pulse width modulator (PWM) controller configured to assert control signals to the gates of the first and second power transistors. The system also includes a high side sensing circuit coupled to the gate and a source of the first power transistor; a low side sensing circuit coupled to the gate and a source of the second power transistor; and a track and hold circuit coupled to the high and low side sensing circuits and configured to couple sense signals from the high and low side sensing circuits.

In another embodiment, a system includes a high side transistor configured to provide a high signal and including a gate and a low side transistor configured to provide a low signal and including a gate, where the low side transistor is connected in series with the high side transistor, where the connection between transistors defines a switch node. The system also include a pulse width modulator (PWM) controller configured to assert control signals to the gates of the high side and low side transistor. The system also includes a high side sensing circuit coupled to the device, where the high side sensing circuit is configured to sense a current corresponding to the high signal, the high side sensing circuit includes a high side output terminal.

The system also includes a low side sensing circuit coupled to the device, where the low side sensing circuit is configured to sense a current corresponding to the low signal, the low side sensing circuit defines a low side output terminal. The system also includes a track and hold circuit coupled to the high side output terminal and the low side output terminal at a feedback node. The track and hold circuit is configured to combine sense signal received on the feedback node and output the combine sense signal on a feedback terminal, where the feedback terminal is coupled to a regulator providing feedback to the PWM controller.

Another embodiment includes a method including sensing a portion of current across a first power transistor, where the first power transistor is connected in series with a second power transistor, and where the first power transistor is configured to deliver a voltage higher than the second power transistor. The method includes amplifying the portion of current across the first power transistor as an amplified high current signal. The method also includes sensing a portion of current across the second power transistor and amplifying the portion of current across the second power transistor as an amplified low current signal. The method also includes combining the amplified high current signal and the low current signal as a combined sense signal. The method includes transmitting the combined sense signal on a sense line; and storing the combined sense signal in a hold circuit.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "connected" "couple" or "couples" is intended to mean either an indirect or direct wired or wireless connection. Thus, if a first device couples to a second device, that connection may be through a direct connection or through an indirect connection via other devices and connections.

Figure 1:
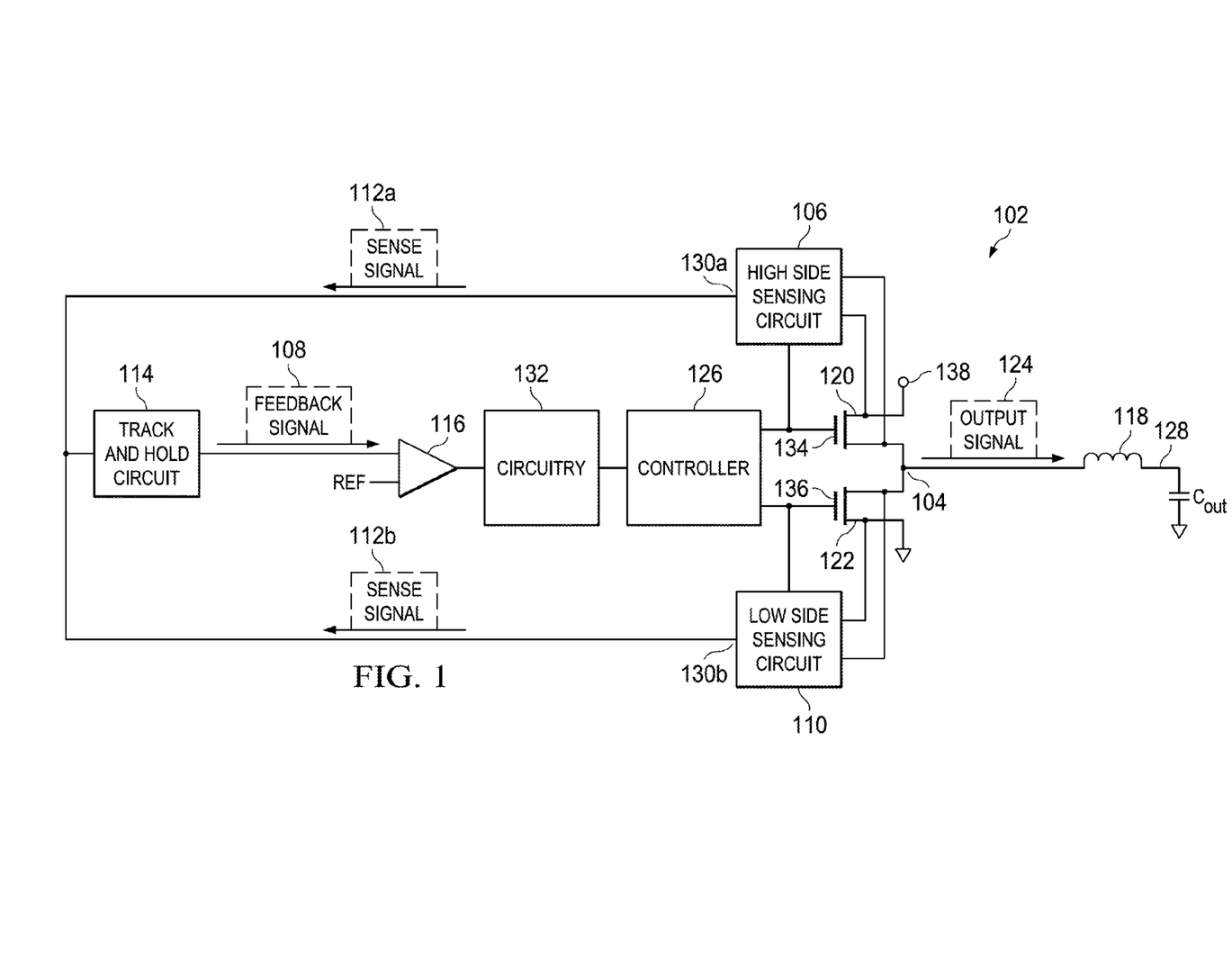
FIG. 1 illustrates a block diagram of a voltage converter with sensing circuits.

FIG. 1 shows a block diagram of a voltage converter with sensing circuits. In various embodiments, the voltage converter of FIG. 1 is a buck converter 102, which generates an output voltage on its output 128. In some cases, the voltage converter may "step down" the input voltage, meaning the output voltage is less than the input voltage at input 138. Buck converters may be useful for tasks such as converting a computer's main (bulk) supply voltage down to lower voltages needed by a bus (e.g., universal serial bus (USB)), memory (e.g., DRAM), a processor, etc. The converter 102 includes a high side transistor 120 and a low side transistor 122.

As shown, sensing circuits are coupled to each transistor 120 and 122. A high side sensing circuit 106 is coupled to the gate, source, and drain of the high side transistor 120. Additionally, a low side sensing circuit 110 is coupled to the gate, source, and drain of the low side transistor 122. Sensing circuits 106 and 110 sense a current (or a corresponding voltage drop) across respective transistors 120 and 122 and provide this information as sense signals to a controller 126. The track and hold circuit 114 may temporarily store a received sense signal from the sense circuits 106 and 110. Outputs of the high side sensing circuit 106 and the low side sensing circuit 110 (e.g., sense signals 112a and 112b) are coupled and transmitted to the track and hold circuit 114. A feedback signal may be output from the track and hold circuit 114 and transmitted through circuitry 132 before reaching the controller 126. For example, the feedback signal may be transmitted from the track and hold circuit 114 to an error amplifier 116 and subsequently to feedback circuitry 132. Feedback circuitry 132 may comprise amplifiers, resistors, capacitors, etc. to produce a signal that is input into the controller 126. The controller 126 regulates the output voltage of the converter 102 based on the feedback signal from the feedback circuitry 132. In one embodiment, the controller 126 may be configured to regulate the inductor 118 current.

The converter 102 includes a high side transistor 120 connected in series with a low side transistor 122, the transistors 120 and 122 are serially connected between two potential levels (e.g., power and ground or power and a negative voltage) to deliver charge to inductor 118. A switch node 104 is defined by the connection between transistors 120 and 122 through which an output signal 124 is transmitted. The switch node 104 is connected to one terminal of an inductor 118. The opposite terminal of the inductor 118 represents the output node 128 of the converter 102 and may be connected to a capacitor and a load (not shown). The controller 126 is configured to turn transistor 120 on or off through assertion of a control signal to a gate 134 of the transistor 120. Similarly, the controller 126 may turn transistor 122 on or off through a control signal to a gate 136 of the transistor 122.

The controller 126 of the DC-to-DC converter 102 may individually toggle on and off the pair of transistors 120 and 122 to create a voltage signal at output node 128. During operation of the converter 102, the controller 126 may operate in a pulse width modulation (PWM) mode in which only one of the two transistors 120 and 122 is on at any point in time. The transistors reciprocally turn on and off according to a duty cycle implemented by the controller 126. When the high side transistor 120 is on, the switch node 104 is pulled high thereby causing an increase in the current to the inductor 118. When the low side switch 122 is on, the current through the inductor may discharge to the rest of the circuit as the low side transistor 122 causes the switch node 104 to be pulled low. Thus a current at switch node 104 may be transmitted through the switch node 104 to inductor 118.

The inductor 118 produces an opposing voltage across its terminals in response to the changing current. Thus the inductor 118 counteracts the voltage transmitted through the switch node 104 and therefore reduces the net voltage across the load. As the rate of change of current decreases, the voltage across the inductor 118 also decreases which increases the voltage at the output node 128, thus a voltage at output node 128 may be produced. The voltage level on the output node 128 may be varied based on the duty cycle imposed by the controller 126 for turning on and off the power transistors 120 and 122. For example, assuming the input voltage 138 remains the same throughout a duty cycle, the duty cycle in which the high side transistor 120 is on for 70% of the duty cycle with the low side transistor 122 being on for 30% of the duty cycle produces a higher signal on the output node 128 than if the high side transistor 120 were on for 10% of a duty cycle while the low side transistor 122 is on for 90% of the duty cycle.

In order to preserve efficiency, some converters may be configured to adapt to different load conditions. Thus the converter may respond differently between light-load and high-load conditions and thus may be further configured to have a continuous operating mode and a discontinuous operating mode. Under high-load conditions, the converter 102 may operate in the continuous operating mode in which one or the other of the transistors 120 and 122 is on at all times. Under light-load conditions, some embodiments of converter 102 may operate in a discontinuous/pulse frequency operating mode where the converter 102 becomes active when the output voltage falls below a certain threshold voltage level. During the discontinuous/pulse frequency mode, the inductor current falls to zero during a part of each duty cycle in which neither transistor 120 or 122 is on.

In various embodiments, feedback circuits may be included for the converter 102 to regulate the inductor current and thus the voltage at the output node 128. For example, a sense circuit may be coupled to the high side transistor 120 to sense a current or voltage drop across high side transistor 120 when the transistor 120 is on. However, including a sense circuit only for the high side transistor 120 may not produce reliable feedback information for low duty cycle operation in which the high side transistor 120 is on for much less time than the low side transistor 122 during each cycle. In various embodiments, separate sensing circuits are coupled to the high and low side transistors 120, 122. As shown in FIG. 1, sensing circuit 106 is coupled to the high side transistor 120 and sensing circuit 110 is coupled to the low side transistor 122. Each sensing circuit 106 and 110 may produce a sense signal at respective output terminals 130a and 130b. In various embodiments, such as those described below, a sense signal 112a or 112b may correspond to a detected current or voltage across a corresponding high or low side transistor of the converter 102. The sense signal 112a or 112b may be a voltage or current. The sense signals 112a, 112b may be combined and temporarily stored in the track and hold circuit 114.

In various embodiments, the track and hold circuit 114 retains the combined sense signal for a sufficient period of time such that the combined sense signal is usable to feedback circuitry 132. In one example, the feedback circuitry 132 may use the combined sense signal to provide a feedback signal to the controller 126 which in turn regulates the inductor current taking into account the feedback received from the circuitry 132. In such a manner, the sensing circuits 106 and 110 may be used in a voltage converter to help regulate the output current and in turn affect voltage regulation.

Figure 2:
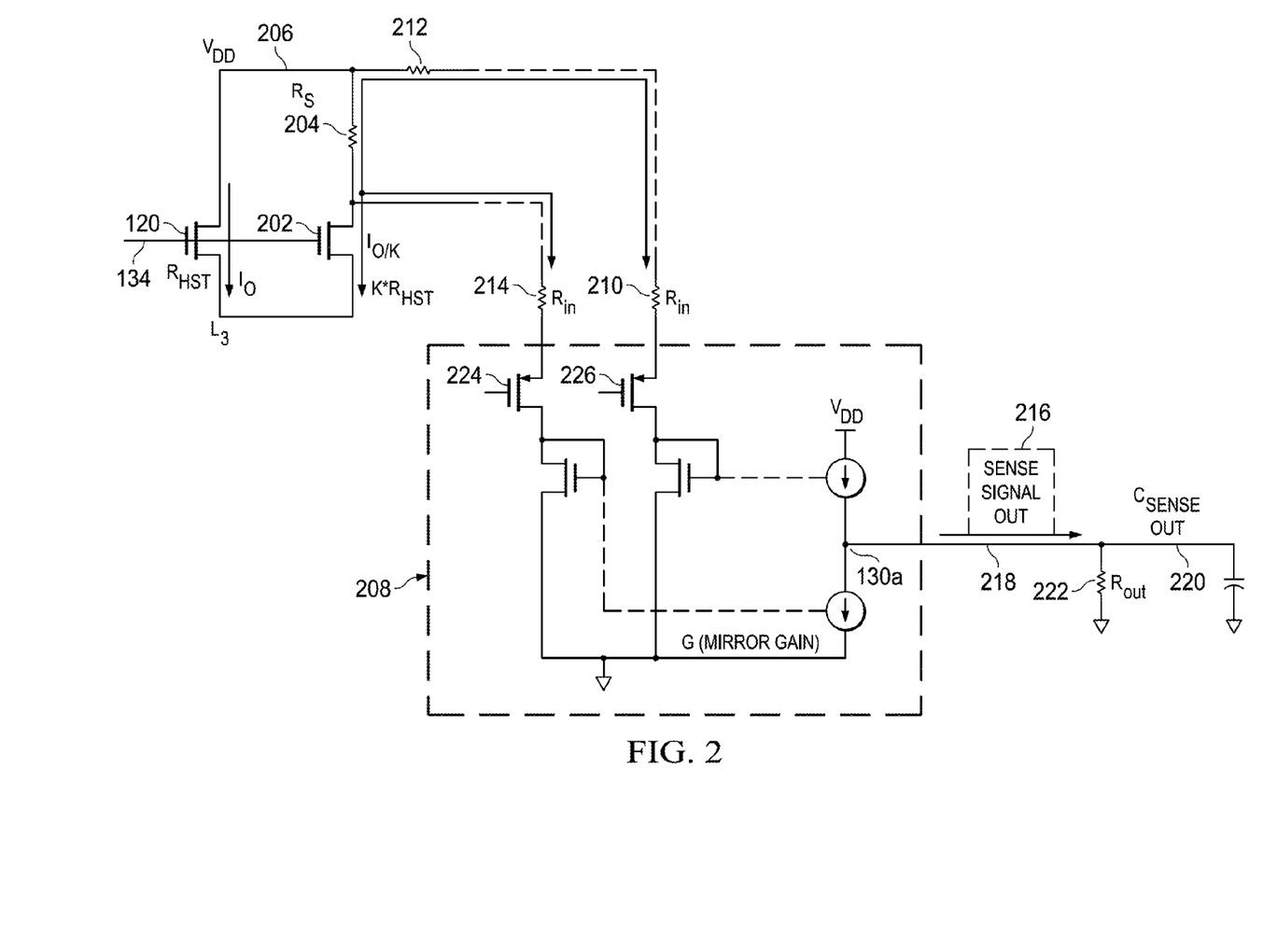
FIG. 2 illustrates a circuit diagram of a sensing circuit in accordance with various examples.

Turning now to FIG. 2, a circuit diagram of an example embodiment of high side sensing circuit 106 is shown. High side transistor 120 includes a gate 134. A sense transistor 202 and a sense resistor 204 are connected to each other in series. The sense transistor 202 and sense resistor 204 are connected in parallel with the high side transistor 120. One terminal of the sense resistor 204 is connected to a drain of the sense transistor 202. The other terminal of the sense resistor 204 is connected to a drain of the high side transistor 120 at a voltage node 206. In various embodiments, the voltage node 206 is the same as the input voltage 138 of the converter 102.

In some embodiments, the on resistance of the high side transistor 120 may range from 50 milliohms-100 milliohms, and may be 65 milliohms in one example. A size of a transistor may be based on various parameters in the transistor such as a channel length or a channel width. Sense transistor 202 is smaller than high side transistor 120 and may be smaller than the high side transistor 120 by a factor of k. In various embodiments, the sense transistor 202 may have a larger on resistance (thus an on resistance of the sense transistor 202 is shown to be $k*R_{HST}$, where $R_{HST}$ is an on resistance of the high side transistor 120), where the larger on resistance may be brought about by manufacturing a transistor that is narrower, has less area, etc. Accordingly an on resistance of sense transistor 202 is k times that of the on resistance of high side transistor 120. A control signal asserted at gate 134 is also asserted at a gate of sense transistor 202. Accordingly, the control signal from the controller 126 that turns on and off the high side transistor 120 also turns on and off the sense transistor 202. Once a control signal is asserted at the gates of transistors 120 and 202, a current flowing through sense resistor 204 may be $I_o/k$ where $I_o$ represents the current flowing through high side transistor 120 in an on state of the transistor 120. As depicted, a conventional flow notation is used to show the flow of current through the circuit, as opposed to electron flow notation.

A current amplifier 208 is connected to both terminals of the sense resistor 204 and is configured to detect a voltage drop across the sense resistor 204, or an amount of current through the sense resistor 204 and amplify the voltage drop or current sensed through sense resistor 204. The gates of two p-channel metal-oxide semiconductor field-effect (PMOS) transistors 224 and 226 are set to an appropriate voltage so that resistor 214 and resistor 210 have reference currents. Thus, one reference current may enter the current amplifier 208 through resistor 210. Resistor 210 is connected serially to resistor 212 coupling the voltage node 206. Another reference current may enter the current amplifier 208 through a resistor 214. Thus the different reference currents may be amplified and a difference between the two amplified reference currents may be transmitted through the high side output terminal 130a as a sense signal 216 to node 218.

As an example, in various embodiments, an output voltage at node 218 may be calculated by the following equation:

$$\text{Csenseout} = I_o * R_{HST} * [R_s/(K * R_{HST} + R_s)] * (1/R_{in}) * G * R_{out} \quad (1)$$

where Csenseout represents a voltage at feedback node 220 which receives a sense signal 216 through high side output node 218, $I_o$ represents a current through the high side transistor 120, $R_{HST}$ represent a resistance of transistor 120 in an on state, $R_s$ represents a resistance of resistor 204, K is a factor correlating a size of the sense transistor 202 and a size of the high side transistor 120, where the size of the high side transistor 120 is k times the size of the sense transistor 202, $R_{in}$ represents resistances of resistors 210 and 214, G represents a current gain of the current amplifier 208, and $R_{out}$ represents a resistance of resistor 222.

Portions of the equation (1) may be broken down as follows. $R_{HST}$ represents a voltage drop across the high side transistor 120. $[R_s/(K*R_{HST}+R_s)]$ is based on the voltage divider ratio, thus $R_{HST}*[R_s/(K*R_{HST}+R_s)]$ represents the voltage drop across Rs (resistor 204). $(1/R_{in})*G$ represents the differential pair gm and mirror gain. The resistances of $R_{in}$ and $R_{out}$ are matched, thus their absolute values do not matter much. In various embodiments, $R_s$ may be selected to minimize a temperature coefficient of the $R_s$ voltage drop while keeping a voltage divide ratio reasonable. In various embodiments, the input pair(PMOS 224 and 226) gm may be high enough so that $1/R_{in}$ dominates the final gm.

The equation (1) may be rewritten as:

$$\text{Csenseout} = I_o * [(R_{HST}*R_s)/(K*R_{HST}+R_s)] * (R_{out}/R_{in}) * G \quad (2)$$

Figure 3:
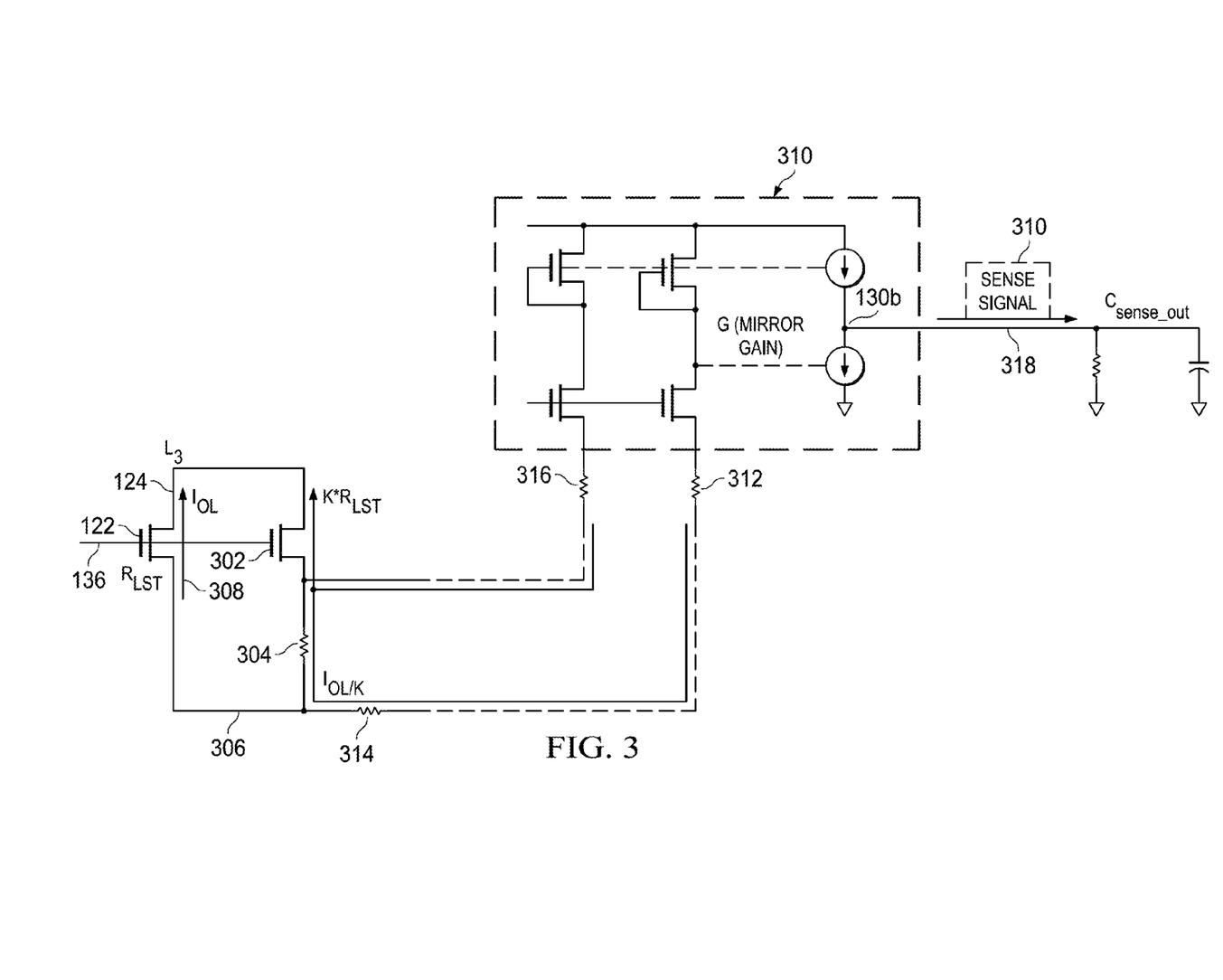
FIG. 3 illustrates a circuit diagram of a sensing circuit in accordance with various examples.

Turning now to FIG. 3, a circuit diagram of an example embodiment of low side sensing circuit 110 is shown. In various embodiments, a signal on the node 218 (FIG. 2) of the high side sensing circuit 106 is combined with a signal transmitted from the low side sensing circuit 110 to provide a feedback signal to the circuitry 132 and ultimately a controller 126 of the converter 102. Low side transistor 122 is illustrated with gate 136. A sense transistor 302 and a sense resistor 304 are connected to each other in series and in turn the sense transistor 302 and sense resistor 304 are connected in parallel with the low side transistor 122. One terminal of the sense resistor 304 is connected to a source of the sense transistor 302. The other terminal of the sense resistor 304 is connected to a source of the low side transistor 122 at a voltage node 306.

In some embodiments, the on resistance of the low side transistor 122 may range from 50 milliohms-100 milliohms, and may be 65 milliohms in one example. As mentioned previously, a size of a transistor may be based on various parameters in the transistor such as a channel length of a channel width. Sense transistor 302 is smaller than low side transistor 122 and may be smaller than the low side transistor 122 by a factor of k. In various embodiments, the sense transistor 302 may have a larger on resistance (thus an on resistance of the sense transistor 302 is shown to be $k*R_{LST}$), where the larger on resistance may be brought about by manufacturing a transistor that is narrower, has less area, etc. Accordingly an on resistance of sense transistor 302 is k times that of the on resistance of low side transistor 122. A control signal asserted at gate 136 is also asserted at a gate of sense transistor 302. Accordingly, the control signal from the controller 126 that turns on and off the low side transistor 122 also turns on and off the sense transistor 302. Once a control signal is asserted at the gates of transistors 122 and 302, a current flowing through sense resistor 302 may be $I_{oL}/k$ where $I_{oL}$ represents the current flowing through low side transistor 122 in an on state of the transistor 122.

When current flows, as depicted in conventional flow notation, through the low side transistor 122 during an on state, the current $I_{oL}$ 308 flows from ground or reference voltage on voltage node 306 toward the switching node 124 and a "low" signal is transmitted to the switching node 124. The current that is sensed through the sense resistor 304 moves in a similar direction as $I_{oL}$ 308, from a reference node 306 toward the switching node 124. The current flowing through the sense resistor 304 is converted into a voltage across resistor 304 and the voltage creates differential current in resistor 316 and resistor 312. The current may be amplified by a current amplifier 310, where the amplified current is transmitted as a sense signal 310 on node 318.

The current amplifier 308 is connected to both terminals of the sense resistor 304 and is configured to detect a voltage drop across the sense resistor 304, or an amount of current through the sense resistor 304 and amplify the voltage drop or current sensed through sense resistor 304. A reference current may be transmitted through resistor 312. Resistor 312 is connected serially to resistor 314 coupling the voltage node 306. Another reference current may be transmitted through a resistor 316. The different reference currents may be amplified and a difference between the two amplified reference currents may be transmitted through low side output terminal 130b as a sense signal 310 to node 318.

Figure 4:
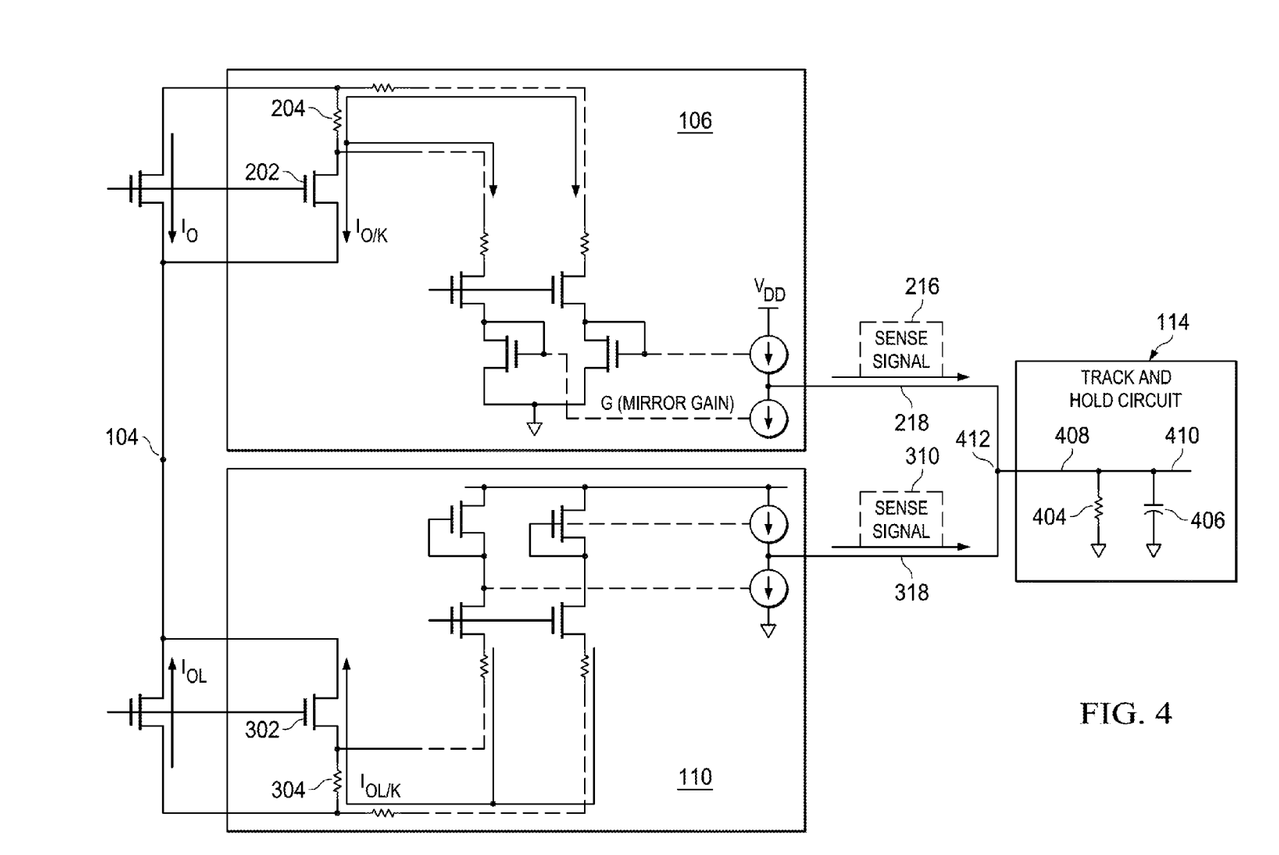
FIG. 4 illustrates a circuit diagram of a sensing circuit in accordance with various examples.

Turning now to FIG. 4, a circuit diagram is shown depicting both the high side sensing circuit 106 and the low side sensing circuit 110 as well as circuitry in a track and hold circuit 114. The track and hold circuit contributes to providing a robust feedback signal to the controller 126 during operation of the converter 102. As shown a sense signal 216 or a sense signal 310 may be transmitted to the track and hold circuit 114 through node 412. As both sense signals 216 and 310 are received through node 412, the sense signals 216 and 310 are combined and transmitted to the track and hold circuit 114.

The track and hold circuit 114 includes an output resistor 404 coupled to feedback node 408. A capacitor 406 is coupled in parallel with the output resistor 404. In various embodiments, the resistor 404 may produce a voltage that the capacitor 406 subsequently holds during a period of time including periods of time that a signal is not present on feedback node 408. Accordingly, a signal may be continuously provided to the controller 126 even during periods of no signal from either the high side sensing circuit 106 or the low side sensing circuit 110 due to the track and hold circuit 114. However, the duration in which the track and hold circuit 114 may continue to provide a feedback signal is constrained by the capacitor 406 discharging cycle during periods of no signal from either the high side sensing circuit 106 or the low side sensing circuit 110.

For example, when the high side transistor 120 is on and the high side sensing circuit 106 provides a sense signal to the track and hold circuit 114, the resistor 404 converts the signal to a voltage value and the capacitor 406 helps to hold that voltage value for a period of time. As things shift, and the converter 102 transitions between turning the high side transistor 120 off and turning the low side transistor 122 on, until the time the low side sensing circuit 110 starts transmitting a sense signal, the capacitor 406 in the track and hold circuit 114 will discharge onto the feedback node 408 resulting in providing a valid voltage to the control loop including the circuitry 132 and controller 126. Thus, upon receiving a combined sense signal, the track and hold circuit 114 temporarily retains the received combined sense signal for a sufficient period of time such that the combined sense signal is usable to feedback circuitry 132. During a time that no feedback signal is bring provided to the track and hold circuit 114, the capacitor 406 will slowly discharge stored charge into ground.

Given the configuration and operation of the converter 102, a voltage on the switch node 104 may swing from rail to a reference voltage (e.g., ground or a negative voltage). However, given the configuration of the sense circuit 106 and 110, the sense resistors 204 and 304 do not experience the same voltage swings as experienced by the switch node 104. Such a configuration allows for the current amplifiers 208 and 310 to function without the use of additional circuitry to block high voltages or without needing to be fast.

Figure 5:
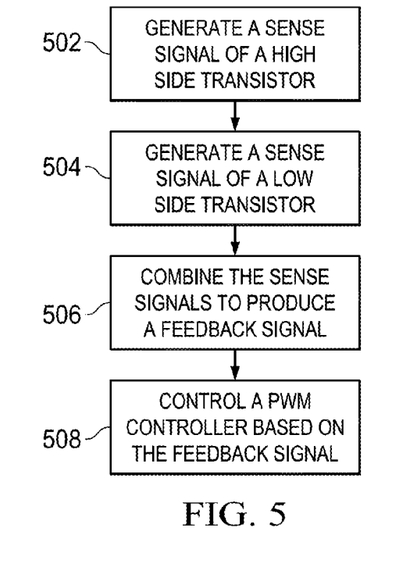
FIG. 5 illustrates a method in accordance with various examples.

FIG. 5 shows an example method in accordance with at least some embodiments for sensing in a voltage converter including a high side transistor and a low side transistor. In various embodiments, some of the blocks shown in FIG. 5 may be performed concurrently, in a different order than shown, or omitted. Additional method elements may be performed as desired.

At block 502 a sense signal of a high side transistor may be generated. As discussed, the sensing may be done by the high side sensing circuit 106 which may output a sense signal on a high side output terminal 130a. At block 504, a sense signal of a low side transistor may be generated. For example, the sensing may be done by the low side sensing circuit 110 which may output a sense signal on a low side output terminal 130b.

Next the sense signals may be combined at block 506, to produce a feedback signal. As the voltage converter 102 operates based on a high side transistor being on or a low side transistor being on, different signal may be produced on either the high side output terminal 130a or the low side output terminal 130b. The received sense signals may be transmitted through the track and hold circuit 114 and based on the sense signals transmitted as a feedback signal at block 508 a PWM controller may in turn affect the operation of the voltage converter 102.

Figure 6:
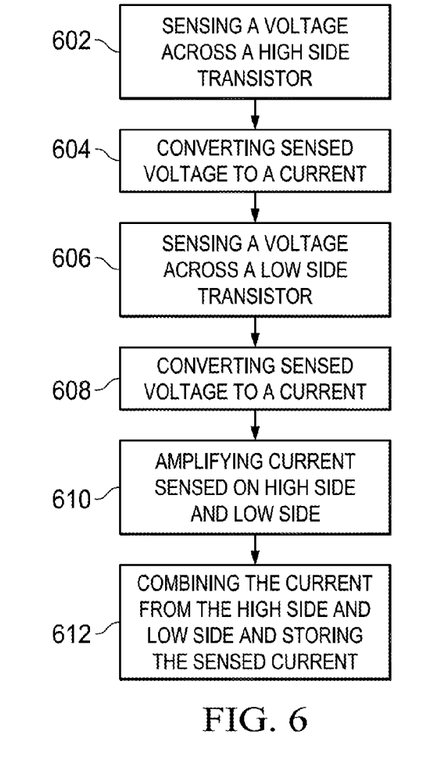
FIG. 6 illustrates a method in accordance with various examples.

FIG. 6 shows an example method in accordance with at least some embodiments for sensing in a voltage converter including a high side transistor and a low side transistor. In various embodiments, some of the blocks shown in FIG. 6 may be performed concurrently, in a different order than shown, or omitted. Additional method elements may be performed as desired.

At block 602, a high side sensing circuit 106 may sense a voltage across a high side transistor. At block 604 the high side sensing circuit 106 may convert the sensed voltage to a current. As discussed, the sensing circuit may include a sense resistor and a sense transistor placed in parallel with the high side transistor to detect a portion of the current flowing through the high side transistor. At block 606, the low side sensing circuit 110 may sense a voltage across a low side transistor. Similar to sensing on the high side, the low side sensing circuit may include a sense resistor and sense transistor placed in parallel with the low side transistor to detect a portion of the current flowing through the low side transistor. At block 608 a sensed voltage may be converted to a current.

At block 610 current sensed on both the high side and the low side may be amplified. This may be done by respective current amplifiers in the high side sensing circuit 106 and the low side sensing circuit 110. At block 612, sense signals, in the form of current from the high side and low side may be combined and stored in a track and hold circuit. As discussed, the track and hold circuit may be coupled to a feedback terminal and may include a resistor and a capacitor placed in parallel with the resistor.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
   a first power transistor including a gate;
   a second power transistor including a gate and connected in series with the first power transistor, wherein the connection between the transistors defines a switch node;
   a pulse width modulator (PWM) controller configured to assert control signals to the gates of the first and second power transistors;
   a high side sensing circuit coupled to the gate and a drain of the first power transistor;
   a low side sensing circuit coupled to the gate and a drain of the second power transistor; and
   a track and hold circuit coupled to the high and low side sensing circuits and configured to couple sense signals from the high and low side sensing circuits.

2. The system of claim 1 wherein the high side sensing circuit further comprises:
   a sensing resistor in series with a sensing transistor, the sensing resistor and the sensing transistor in parallel with the first power transistor, the sensing resistor coupling a drain of the first power transistor and a drain of the sensing transistor, the sensing resistor coupling the drain of the first power transistor at a voltage node;
   a plurality of serially-connected resistors coupled to the voltage node;
   a second resistor coupled to the drain of the sensing transistor; and
   a current amplifier including an output coupled to an output terminal of the high side sensing circuit, the current amplifier configured to sense a voltage across the sensing resistor and amplify sensing resistor current corresponding to the voltage.

3. The system of claim 2,
wherein the current amplifier includes a current mirror configured to source current, wherein mirror sourcing current is provided to the high output terminal of the high side sensing circuit, and
wherein the current amplifier is coupled to both sides of the sensing resistor.

4. The system of claim 2 wherein the low side sensing circuit further comprises:
a low side sensing resistor in series with a low side sensing transistor, the low side sensing resistor and the low side sensing transistor in parallel with the second power transistor, the low side sensing resistor coupling a source of the second power transistor and a source of the low side sensing transistor, the low side sensing resistor coupling the source of the second power transistor at a low side voltage node;
a plurality of serially-connected low side resistors coupled to the low side voltage node;
a low side resistor coupled to the source of the low side sensing transistor; and
a low side current amplifier including a low side output coupled to a low side output terminal of the low side sensing circuit, the low side current amplifier configured to sense a low side voltage across the low side sensing resistor and amplify low side sensing resistor current corresponding to the low side voltage.

5. The system of claim 4, wherein the track and hold circuit further comprises:
an output resistor coupled to a feedback node coupling the output terminal and the low side output terminal, wherein the track and hold circuit is configured to couple sense signals further comprises combining a signal corresponding to amplified sensing resistor current and amplified low side sensing resistor current; and
a capacitor in parallel with the output resistor configured to store the coupled sense signals.

6. The system of claim 1 wherein the low side sensing circuit further comprises:
a sensing resistor in series with a sensing transistor, the sensing resistor and the sensing transistor in parallel with the second power transistor, the sensing resistor coupling a source of the second power transistor and a source of the sensing transistor, the sensing resistor coupling the source of the second power transistor at a voltage node;
a plurality of serially-connected resistors coupled to the voltage node;
a second resistor coupled to the source of the sensing transistor; and
a current amplifier including an output coupled to an output terminal of the low side sensing circuit, the current amplifier coupled to the plurality of serially-connected resistors and the second resistor.

7. The system of claim 6,
wherein the current amplifier includes a current mirror sourcing current, wherein mirror sourcing current is provided to the output terminal of the low side sensing circuit, and
wherein the current amplifier is configured to sense a voltage across the sensing resistor and amplify a sense current corresponding to the voltage.

8. The system of claim 1, wherein the track and hold circuit further comprises:
an output resistor coupled to a feedback node coupling an output terminal of the high side sensing circuit and an output terminal of the low side sensing circuit; and
a capacitor in parallel with the output resistor,
wherein the output resistor is configured to create a voltage that is stored in the capacitor.

9. The system of claim 8, wherein the track and hold circuit further includes a feedback terminal coupled to the feedback node, the feedback terminal coupled to a regulator that provides feedback to the PWM controller.

10. A system comprising:
a high side transistor configured to provide a high signal and including a gate;
a low side transistor configured to provide a low signal and including a gate, the low side transistor connected in series with the high side transistor, wherein the connection between transistors defines a switch node;
a pulse width modulator (PWM) controller configured to assert control signals to the gates of the high side and low side transistors;
a high side sensing circuit coupled to the device, the high side sensing circuit configured to sense a current corresponding to the high signal, the high side sensing circuit includes a high side output terminal;
a low side current sensing circuit coupled to the device, the low side sensing circuit configured to sense a current corresponding to the low signal, the low side sensing circuit defines a low side output terminal; and
a track and hold circuit coupled to the high side output terminal and the low side output terminal at a feedback node and configured to combine sense signals received on the feedback node and output the combined sense signal on a feedback terminal, wherein the feedback terminal is coupled to a regulator providing feedback to the PWM controller.

11. The system of claim 10 wherein the high side sensing circuit further comprises:
a high side sensing resistor connected in series with a high side sensing transistor, the high side sensing resistor and the high side sensing transistor connected in parallel with the high side transistor;
a first reference resistor coupled to a high side voltage node where a drain of the high side transistor and a first end of the high side sensing resistor are connected;
a second reference resistor coupled to a second end of the high side sensing resistor; and
a high side current amplifier including an output coupled to a high side output terminal of the high side sensing circuit, the high side current amplifier configured to:
receive reference currents transmitted through the first and second reference resistors;
amplify the reference currents as a high side sense signal; and
transmit the high side sense signal to the high side output terminal.

12. The system of claim 11, wherein the high side current amplifier includes a current mirror configured to source current, wherein mirror sourcing current is provided to the high side output terminal.

13. The system of claim 11 wherein the low side sensing circuit further comprises:
a low side sensing resistor connected in series with a low side sensing transistor, the low side sensing resistor and the low side sensing transistor connected in parallel with the low side transistor;

a third reference resistor coupled to a low side voltage node where a source of the low side transistor and a first end of the low side sensing resistor are connected;

a fourth reference resistor coupled to a second end of the low side sensing resistor; and a low side current amplifier including an output coupled to the low side output terminal of the low side sensing circuit, the low side current amplifier configured to:
receive low side reference currents transmitted through the third and fourth reference resistors;
amplify the low side reference currents as a low side sense signal; and
transmit the low side sense signal to the low side output terminal.

14. The system of claim 13, wherein the low side current amplifier includes a current mirror configured to source current, wherein mirror sourcing current is provided to the low side output terminal.

15. The system of claim 13, wherein the track and hold circuit further comprises:
an output resistor coupled to the feedback node, wherein the high side output terminal and low side output terminals are coupled to the feedback node; and
a capacitor in parallel with the output resistor, wherein the output resistor and capacitor are configured to store a coupled sense signal including the high side sense signal and the low side sense signal.

16. The system of claim 10 wherein the low side sensing circuit further comprises:
a sensing resistor connected in series with a sensing transistor, the sensing resistor and the sensing transistor connected in parallel with the low side transistor;
a first reference resistor coupled to a low side voltage node where a source of the low side transistor and a first end of the low side sensing resistor are connected;
a second reference resistor coupled to a second end of the low side sensing resistor; and
a current amplifier including an output coupled to the low side output terminal of the low side sensing circuit, the current amplifier configured to:
receive reference currents transmitted through the first and second resistors;
amplify the reference currents as a low side sense signal; and
transmit the low side sense signal to the low side output terminal,
wherein the track and hold circuit configured to couple sense signal from the high and low side sensing circuits further comprises the track and hold circuit configured to combine the low side sense signal with a sense signal provided by the high side sensing circuit and storing the combined low side sense signal and the sense signal provided by the high side sensing circuit.

17. The system of claim 16, wherein the track and hold circuit further comprises:
an output resistor coupled to the feedback node; and
a capacitor in parallel with the output resistor.

18. A method comprising:
sensing a portion of current across a first power transistor, the first power transistor connected in series with a second power transistor, the first power transistor configured to deliver a voltage higher than the second power transistor;
amplifying the portion of current across the first power transistor as an amplified high current signal;
sensing a portion of current across the second power transistor;
amplifying the portion of the current across the second power transistor as an amplified low current signal;
combining the amplified high current signal and the low current signal as a combined sense signal;
transmitting the combined sense signal on a sense line; and
storing the combined sense signal in a hold circuit.

19. The method of claim 18 wherein storing the combined sense signal in a hold circuit further comprises:
converting the combined sense signal to a sensed voltage by way of a resistor; and
storing the sensed voltage by way of a capacitor placed in parallel to the resistor.

20. The method of claim 18, further comprising:
transmitting the combined sense signal to a feedback controller to control a pulse width modulation (PWM) controller to regulate an output voltage of a buck converter, the buck converter comprising the first power transistor and the second power transistor, wherein the connection between the first and second power transistor defines a switch node and the switch node is coupled to an inductor in series with a capacitor.

* * * * *